Nov. 5, 1957 H. H. ADELAAR 2,812,134

BINARY ELECTRICAL COUNTING CIRCUIT

Filed June 22, 1953 4 Sheets-Sheet 1

Inventor
H. H. ADELAAR
By Robert Harding Jr.
Attorney

Inventor
H. H. ADELAAR
By Robert Harding Jr.
Attorney

Nov. 5, 1957 H. H. ADELAAR 2,812,134

BINARY ELECTRICAL COUNTING CIRCUIT

Filed June 22, 1953 4 Sheets-Sheet 3

Inventor
H. H. ADELAAR
By Robert Harding Jr.
Attorney

Inventor
H. H. ADELAAR
By Robert Harding Jr.
Attorney

United States Patent Office 2,812,134

Patented Nov. 5, 1957

2,812,134

BINARY ELECTRICAL COUNTING CIRCUIT

Hans Helmut Adelaar, Antwerp, Belgium, assignor to International Standard Electric Corporation, New York, N. Y., a corporation of Delaware Application June 22, 1953, Serial No. 363,230

Claims priority, application Netherlands June 26, 1952

13 Claims. (Cl. 235—61)

The present invention relates to electrical signal pulse counting devices of the type comprising a plurality of cascaded binary counting stages.

The principal object of the invention is to render a multi-stage binary pulse counting chain capable of accepting a train of electrical signal pulses offered thereto concurrently at more than one of the counting stages thereof.

A further object of the invention is to render a counting stage of a multi-stage binary pulse counting chain capable of diverting signal pulses offered simultaneously to said counting stage from a plurality of sources.

One feature of the invention comprises a binary pulse counting device comprising means at one of the counting stages thereof for the detection of coincidence between signal pulses applied to said stage from two different sources, means for relaying a single signal pulse to the succeeding counting stage when said detection means detects coincidence, and means for preventing the application of said coincident signal pulses to said first-mentioned stage.

Another feature of the invention comprises a multi-stage binary pulse counting device comprising means for offering a single signal pulse simultaneously to each of a plurality of the counting stages thereof and means for preventing the application of consequent coincident pulses to any of said plurality of stages.

The invention will now be described with reference to the accompanying drawings, in which.

Figures 1, 2, 3, 4, 5:
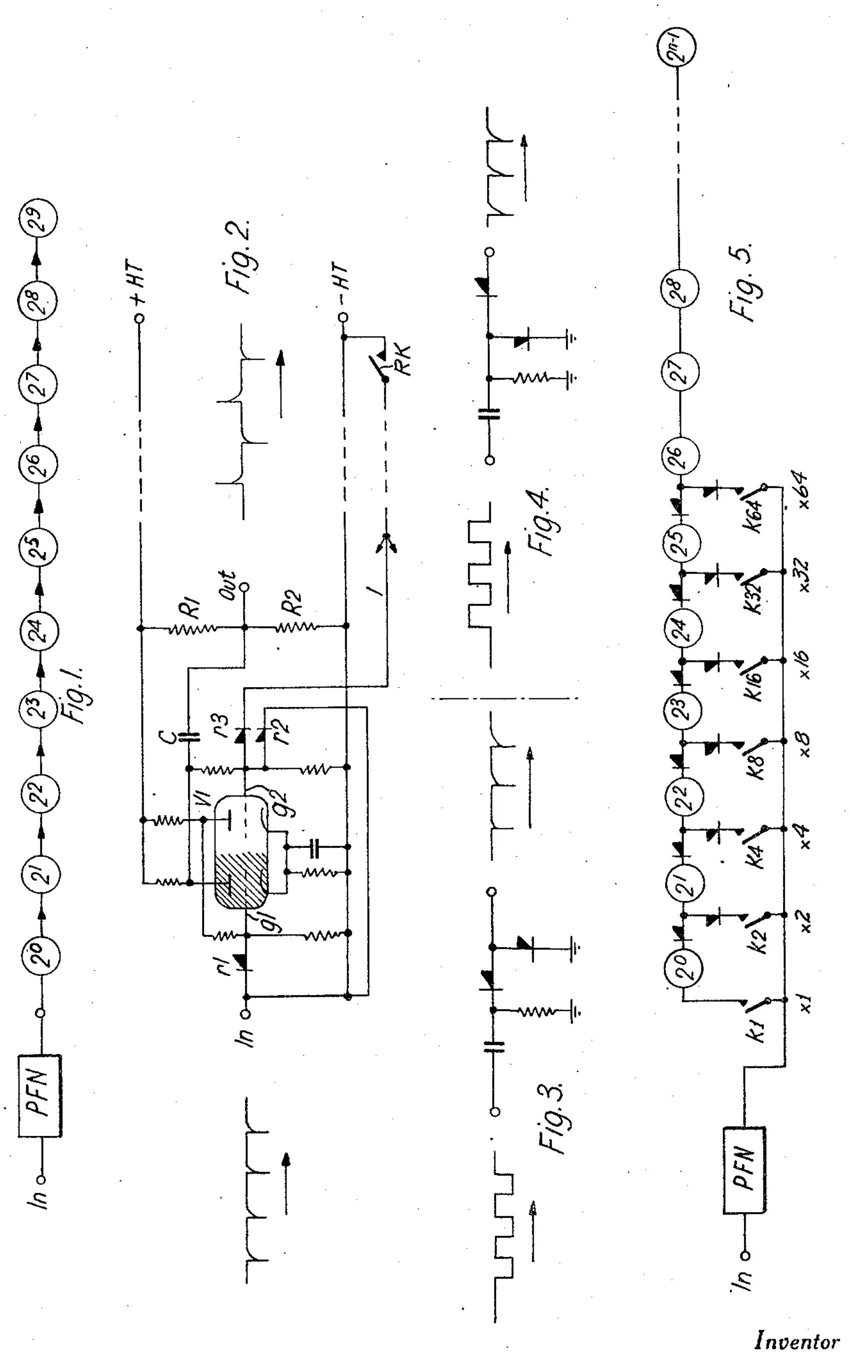
Fig. 1 shows schematically a multi-stage binary pulse counting device.
Fig. 2 is an example of a bi-stable circuit suitable for use in one stage of the device of Fig. 1.
Figs. 3 and 4 are pulse forming networks suitable for use in the device of Fig. 1.
Fig. 5 shows how a multi-stage binary counting device may be used for multiplication.

In the pulse counting devices to be considered, each binary counting stage comprises a bi-stable device, for example, a trigger circuit or a relay circuit, having two conditions of equilibrium. Each counting stage is used to signify the value 0 when in one condition, and the value 1 when in the other condition. The transition alternately from the 0 condition to the 1 condition and vice-versa is effected by successive signal pulses arriving at the pulse input terminal of the stage and at each transition from the 1 condition to the 0 condition a carry-over pulse appears at an output terminal, which is connected to the input terminal of the next stage. Such a counting device comprising 10 binary counting stages is shown in Fig. 1. Signal pulses arriving at the pulse input terminal In are first applied to a pulse forming network PFN, which transmits a sharp edged pulse to the first binary stage ($2^0$) for each pulse received at terminal In.

When all stages of the counting device are in the 0 condition, the first signal pulse arriving at the first stage ($2^0$) causes a transfer of this stage to the 1 condition. The second signal pulse causes it to resume the 0 condition while, at the same time, a carry-over pulse is transmitted to the second binary stage ($2^1$) which thereupon assumes the 1 condition. The third signal pulse again causes a transfer of the first stage to the 1 condition. The fourth signal pulse causes the first stage to return to the 0 condition, while at the same time, a carry-over pulse is transmitted to the second stage which thereupon changes to the 0 condition and in its turn transmits a carry-over pulse to the third binary stage ($2^2$), and so on.

Fig. 2 shows by way of example a bi-stable trigger circuit arrangement which may be used for each binary counting stage in the device according to Fig. 1. It comprises the well known Eccles-Jordon trigger circuit. A negative trigger pulse arriving at the input terminal in is simultaneously applied through rectifiers $r_1$ and $r_2$ to the grids $g_1$ and $g_2$ respectively of a double triode V1 and causes the transfer from one stable condition to the other, alternately. (Because of the rectifiers $r_1$ and $r_2$, positive pulses arriving at terminal In have no effect.) The grid $g_2$ is also connected through rectifier $r_3$ to lead 1, which is common for all counting stages and which may be temporarily connected by closing the contact RK to the —HT terminal in order to reset all trigger circuits to the condition in which the left half of the double triode is conducting and the right half is non-conducting. In this condition, indicated by the shading lines in Fig. 2, the circuit is considered to be registering the count 0. The first trigger pulse to arrive quenches the left half and fires the right half, transferring the circuit to the 1 condition, whereas the second pulse to arrive quenches the right half of the tube and fires the left half, restoring the circuit to the 0 condition. The anode of the left half of the double triode is connected through a small condenser C to the output terminal Out which is also connected to the junction point of a potential divider R1—R2. At each transition from the 0 condition to the 1 condition, a sharp edged positive pulse appears at the output terminal Out, whereas a negative carry-over pulse appears at each transition from the 1 condition to the 0 condition. As the output terminal of each stage is connected to the input terminal of the succeeding stage, the positive pulses appearing at the output terminal remain without effect, whereas each negative carryover pulse causes a transfer in the succeeding stage.

In this way, the pulses of a train of pulses offered to the input terminal of the counting circuit, Fig. 1, are counted and stored in binary form; the condition of each stage of the chain signifies the value, 0 or 1, of a digit in the binary number. Thus, the first stage may be labelled $2^0$, the second $2^1$, etc. In general, the *n*th stage may be labelled $2^{n-1}$. As will be seen, the chain illustrated in Fig. 1 may be used to store any number from 0 up 1023; generally an *n*-stage chain may be used to count up to $2^{n-1}$.

Figs. 3 and 4 show pulse forming networks of well known types which may be used in the counting device shown in Fig. 1, to transform rectangular pulses arriving at the input terminal of the network into sharp edged pulses at the output thereof which in turn may be used to trigger the first binary counting stage.

As explained herebefore, the counting device shown in Fig. 1 may be used to count a train of pulses in a straight-forward manner. However, it may be readily adapted for the storage of a number which is a multiple of the number of pulses in the train; for instance, by connecting the output terminal of the pulse forming network PFN to the second binary stage ($2^1$) instead of the first, the count is multiplied by 2. In the same way, by connecting the pulse forming network to the 3rd, 4th, etc., stage of the chain instead of the first, the count may be multiplied by 4, 8, etc. This manner of using the chain is illustrated in Fig. 5, in which $k_1$, $k_2$, $k_4$, etc. represent contacts any one of which may be closed, as desired, in order to multiply the count by the factor indicated beneath the contact.

It will be appreciated that these contacts must be closed one at a time, and that the multiplier is in consequence restricted to the powers of 2. However, multiplication by ten, for instance, is also possible by repeating the count; that is, the count is first made with contact $k_2$ closed, then repeated with contact $k_8$ closed, or vice-versa.

If, instead, an attempt is made to achieve multiplication by ten by applying the pulses to be counted to the 2nd and 4th stages of the counting chain simultaneously, a difficulty arises at every fourth of these pulses, since it becomes necessary to apply both this pulse and the pulse which appears simultaneously at the output of the third stage ($2^2$) to the input of the fourth stage ($2^3$).

Figure 6:
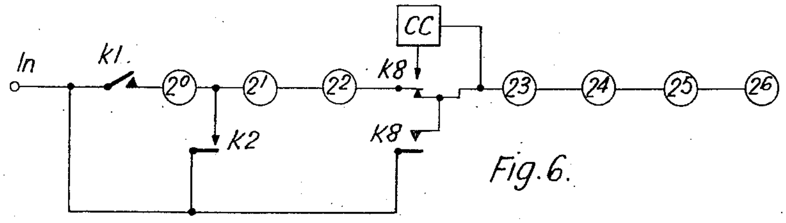
Fig. 6 shows a modification of Fig. 5 for multiplying by ten.

A possible arrangement for meeting this situation is illustrated in Fig. 6. By closing contact $k_1$, the counting circuit is set for straight counting, that is, for multiplication by 1. If contacts $k_2$ and $k_8$ are both closed instead of $k_1$, the input terminal In is connected to the input of the second stage ($2^1$) and also to the input of the fourth stage ($2^3$). The 3rd stage ($2^2$) is disconnected by contact $k_8$ from the 4th and connected instead to a special carry-over circuit CC. Whenever a carry-over pulse appears at the output of the 3rd stage, this pulse is stored in the carry-over circuit, which discharges the pulse into the 4th stage only after the corresponding pulse arriving at that stage directly from terminal In has been stored. It is evident that this solution requires extra time between pulses for the carry-over operation.

The invention discloses novel means by which it is possible to achieve the carry-over operation without the necessity for such a long time interval between pulses.

Figure 7:
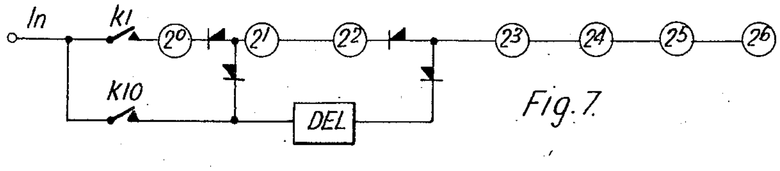
Fig. 7 shows a first embodiment of the present invention.

A first embodiment of the invention is shown in Fig. 7. In this arrangement, a delay circuit DEL is interposed between the input terminal In and the 4th stage of the counting circuit which delays the pulses offered directly to that stage, with respect to the pulses offered to the 2nd stage, in such a way that no coincidence can occur with carry-over pulses emitted by the 3rd stage.

Thus, if contact $k_{10}$ is closed, each of the pulses to be counted and multiplied by ten is offered directly to the 2nd stage ($2^1$) to effect multiplication by 2, and a short time afterwards to the 4th stage ($2^3$) to effect multiplication by 8. Preferably, the delay introduced is equal to approximately half the pulse repetition period. This arrangement may be used in cases where the pulses do not follow each other too quickly and follow each other at a more or less constant rate.

Figure 8:
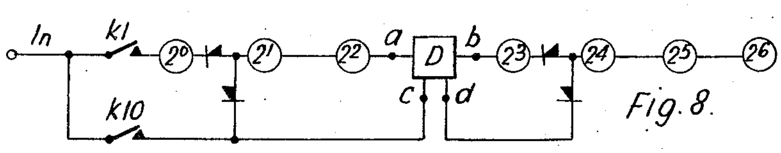
Fig. 8 shows a second embodiment of the present invention.

Such restrictions do not apply to the second embodiment of the invention, illustrated in Fig. 8. In this arrangement, the counting chain is severed between the 3rd and 4th stages and a four-terminal "discriminating" network D, having terminals *a, b, c* and *d*, is inserted in the manner shown, with terminal *a* connected to the output of the 3rd stage, terminal *b* to the input of the 4th stage, terminal *c* to the contact $k_{10}$ and terminal *d* via a decoupling rectifier to the input of the 5th stage ($2^4$). The network D performs the following functions: if a pulse is applied to either terminal *a* or *c* (but not to both), this pulse is reproduced at terminal *b*, whereas terminal *d* remains quiet; if a pulse is applied simultaneously to both terminals *a* and *c*, this pulse is reproduced at terminal *d*, whereas terminal *b* remains quiet. The operation of the counting device is then as follows:

Contact $k_{10}$ having been closed, the first pulse to arrive at terminal In is applied both to the second stage ($2^1$) and to terminal *c* of the discriminating network. The second stage assumes the 1 condition and, since a pulse is applied to terminal *c* and none appears at terminal *a* of the discriminating network from the third stage ($2^2$), this pulse is reproduced at terminal *b* and causes the 4th stage ($2^3$) to assume the 1 condition. The number stored is thus $2^1+2^3$, or ten.

The second pulse to arrive at terminal In restores the second stage to the 0 condition and the third stage accordingly assumes the 1 condition. The same pulse is also applied to terminal *b*, where it restores the fourth stage to 0 condition; this in turn causes the fifth stage ($2^4$) to assume the 1 condition. The number stored is now $2^2+2^4$, or twenty.

The third pulse causes the second and fourth stages to assume the 1 condition once more and the number stored is $2^1+2^2+2^3+2^4$, or thirty.

The fourth pulse causes the second stage to restore to the 0 condition, whereupon a carry-over pulse is applied to the third stage which thereupon restores to the 0 condition and transmits a carry-over pulse to terminal *a* of the discriminating network. Since at the same time a pulse arrives at terminal *c*, there is no output pulse at terminal *b*; instead, a pulse appears at terminal *d*, which pulse is directly applied to the fifth stage. The fifth stage therefore restores to the 0 condition and transmits a carry-over pulse to the sixth stage ($2^5$) which, accordingly assumes the 1 condition. Thus, the fourth pulse leaves the chain with the fourth stage ($2^3$) and the sixth stage ($2^5$) in the 1 condition, whereas all the other stages are in the 0 condition. The chain therefore stores the number $2^3+2^5$, or forty.

It will be noted that each pulse reproduced at terminal *d* produces the same result as two successive pulses at terminal *b*.

It will be evident also that, if contact $k_1$ is closed instead of contact $k_{10}$, a straight count can be made; in this case, all pulses arriving at terminal *a* of the discriminating network are produced at terminal *b* without modification and the counting device operates in the same manner as that of Fig. 1.

Figures 9, 10:
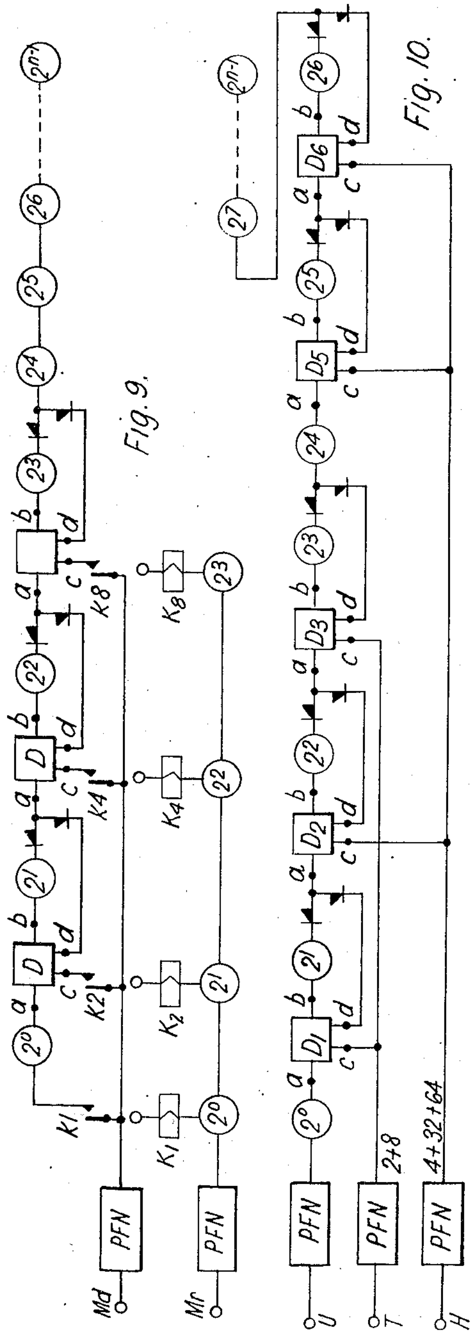
Figs. 9 and 10 show more complex circuits using the principles of Fig. 8.

The principle disclosed may be generalized in different ways, two of which are shown in Figs. 9 and 10, respectively. The device according to Fig. 9, which shows discriminating networks D interposed between three successive pairs of counting stages, may be set to multiply the number of pulses to be counted by any predetermined number within the capacity of the counting device. For instance, by closing contacts $k_1$ and $k_2$ multiplication by the number $2^0+2^1$, or three, may be achieved. Multiplication by 11, which is $2^0+2^1+2^3$, may be achieved by closing contacts $k_1$, $k_2$ and $k_8$; etc. The contacts $k_1$, $k_2$, $k_4$ and $k_8$ may be controlled by relays which are themselves controlled by succeeding stages of a second binary counting chain, such as that shown in the lower part of Fig. 9. This arrangement may, for instance, be used to multiply the number of pulses in one count by the number of pulses in a second count. The count which is used as the multiplier is first applied to the input terminal M*r* and stored in the lower or multiplier counting chain which is arranged to operate the proper combination of the relays $K_1$, $K_2$, $K_4$, $K_8$. Then, the count which serves as multiplicand is applied to terminal M*d* and after multiplication by the multiplier as a result of the closure of some or all of the contacts $k_1$, $k_2$, $k_4$, $k_8$, is stored in the upper counting chain. After resetting the multiplier chain to zero, this operation may be repeated with a different multiplier and multiplicand. The result of the second operation is then automatically added to the result of the first operation.

Fig. 10 shows an application of the circuit arrangement of Fig. 9 to produce a decimal to binary converter. This arrangement has the advantage that trains of pulses representing the hundreds, tens and units digits of a three-digit decimal number may be concurrently applied to the terminals H, T and U respectively. Each discriminating network $D_1$, $D_2$, $D_3$, $D_5$, $D_6$ will take care of coincident pulses arriving from the binary stage connected to its terminal *a*, and directly from the pulse input lead connected to its terminal *c*. It will be clear, from the foregoing description of the operation of the circuit shown in Fig. 9, that each pulse applied to terminal T of Fig. 10 will be multiplied by $2^1+2^3$, or ten, and each pulse applied to terminal H by $2^2+2^5+2^6$, or 100, so that the number stored in the chain will be the binary equivalent of the decimal number represented by the three trains of pulses. It is, of course, also possible to apply the pulse trains representing the respective digits of the decimal number successively to the converter.

If the circuit arrangement illustrated in Fig. 9 is used for high counting rates, difficulties may arise from the fact that a pulse which arrives at terminal *c* of a discriminating network directly from the input terminal is not exactly coincident with a carry-over pulse arriving from the preceding stage connected to its terminal *a*. This could result from a small delay between the moment the trigger pulse arrives at the input terminal of this preceding stage and the moment at which a carry-over pulse from that stage appears. The difficulty assumes greater importance as the discriminating network is located further along the chain, because the delay incurred by a carry-over pulse in succeeding stages is cumulative. Even when the pulses arriving at terminals *a* and *c* of the discriminating network are neither exactly coincident nor completely separated from each other, there remains the risk of pulses appearing at terminal *b* as well as at terminal *d*.

Figure 11:
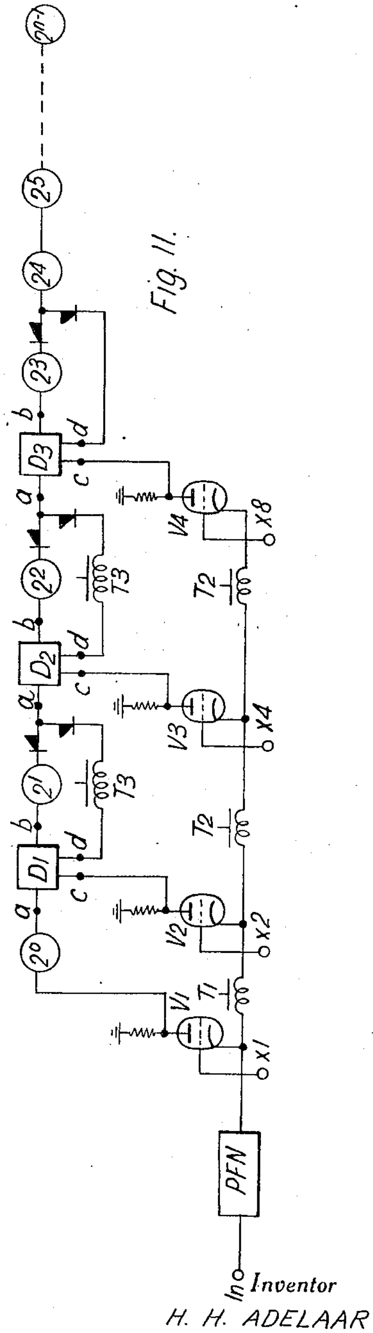
Fig. 11 shows a modification of the circuit of Fig. 8 for use when high counting speeds are desired.

These difficulties may be solved in the manner illustrated in Fig. 11 which shows an arrangement for high counting rates. The pulse input lead is shown as consisting of a series of delay line sections, the first of which has a delay $T_1$ which corresponds to the delay between the input pulse and the carry-over output pulse of a binary counting stage. The second and all following sections have a delay $T_2$, equal to the delay incurred between terminals *a* and *b*, or between terminals *c* and *b*, of the discriminating network, plus the delay encountered between the input and the output pulses of a binary counting stage, the discriminating network being assumed to be of such a design that an equal delay is encountered between terminals *a* and *b*, and between terminals *c* and *b*, whereas in general a different delay is encountered between terminals *a* and *d*, or between terminals *c* and *d*.

The input of the delay line is also connected to the cathode of a tube $V_1$, the anode of which is connected to the input of the first stage of the counting chain. The junction points of the succeeding delay sections are connected respectively to the cathodes of tubes $V_2$, $V_3$, etc., the anodes of which are connected to the terminals *c* of the successive discriminating networks.

Delay sections having a delay $T_3$ are included in the connections between the terminal *d* of each discriminating network and the terminal *a* of the next discriminating network, $T_3$ being equal to $T_2$ minus the delay between terminals *c* and *d* of the network. When the delay between terminals *a* and *b* of the discriminating network is equal to the delay between terminals *a* and *d*, $T_3$ is equal to $T_2$. On the other hand, $T_2$ may be chosen to be equal to the delay between terminals *a* and *d*, in which case $T_3$ is zero and the corresponding delay sections can be omitted.

It is to be observed that no delay section is required in the connection from terminal *d* of the last discriminating network in the chain, as there can be no coincidence of pulses beyond this stage. In the rest condition, tubes $V_1$, $V_2$ etc. are negatively biassed beyond cut off, sufficiently to prevent any pulses from arising at the anodes when negative pulses are applied to the cathodes. The circuit may be set to multiply the number of pulses by a selected multiplier by reducing the grid bias at predetermined ones of these tubes, in accordance with the value of the multiplier, to approximately the cut off value. Pulses arriving at the terminal I*n* are shaped by the pulse forming network PFN into steep edged negative going pulses which are successively applied to the cathodes of all tubes. Those tubes of which the bias has previously been reduced conduct and transmit negative pulses at their anodes, whereas the others remain nonconducting. By the action of the different delay lines, pulses simultaneously arriving at terminals *a* and *c* of any discriminating network are substantially coincident.

Circuits which may be used as discriminating networks in the arrangements described above, will now be described with reference to Figs. 12–14.

Figure 12:
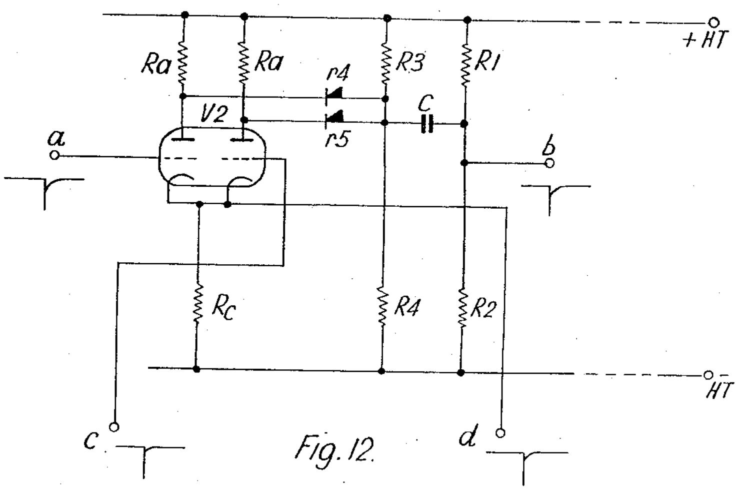
Figs. 12 to 14 show discriminating networks suitable for use in the circuits of Figs. 8, 9, 10 and 11.

Fig. 12 shows a discriminating network using a double triode $V_2$, in which the grids are connected to terminals *a* and *c* respectively and both cathodes are connected to terminal *d* and also to terminal —IT through a large cathode resistor R*c*. The anodes are connected to +HT through equal anode resistors R*a* and each is connected through a decoupling rectifier, $r_4$ and $r_5$ respectively, to the junction point of a potential divider $R_3$—$R_4$. Terminal *b* is also connected to this junction point through a coupling capacitor C and to the junction point of a potential divider $R_1$—$R_2$. The operation is as follows:

Normally, terminals *a* and *c* are held at the same potential, permitting equal anode currents to flow in both halves of the double triode. Accordingly, the two anodes are at the same potential, the latter being equal to, or slightly more positive than, the potential at the junction point of the divider $R_3$—$R_4$, so that the two rectifiers, $r_4$ and $r_5$ are normally blocked. If now a negative pulse is applied to terminal *a*, the left half of the double triode is cut off, whereas the anode current in the right half becomes approximately double its initial value. Therefore, while the potential of the cathodes is not appreciably changed, the anode of the right triode becomes sufficiently more negative to make the rectifier $r_5$ conductive. In this way, the negative pulse is reproduced at terminal *b*, whereas no pulse appears at terminal *d*. The result is the same if a negative pulse is applied to terminal *c* only. If, on the other hand, coincident negative pulses are applied to both terminals *a* and *c*, the cathodes become more negative and the anodes more positive. Consequently, a negative pulse is reproduced at terminal *d*, whereas no pulse appears at terminal *b*, since the rectifiers $r_4$ and $r_5$ remain blocked.

Figure 13:
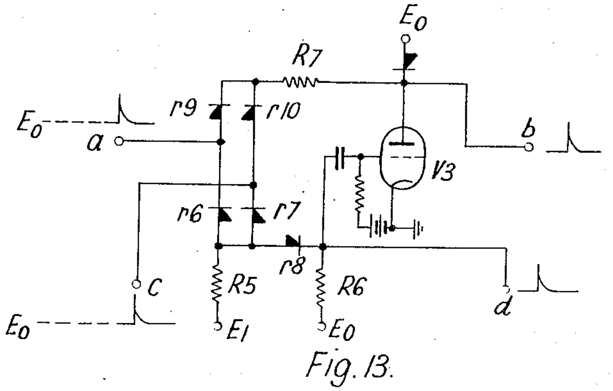
Figure 14:
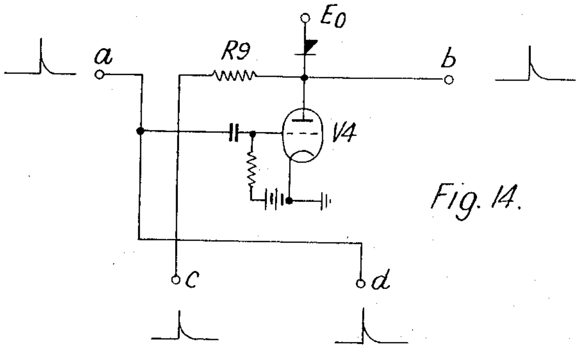

Fig. 13 shows a modified arrangement using only one triode. This circuit operates with positive pulses but it will be understood that it may easily be adapted for operation with negative pulses. The operation is as follows:

It is supposed that terminals *a* and *c* are normally at potential $E_0$ and that the tube $V_3$ is non-conductive. A current flows from the source of potential $E_1$ (more positive than $E_0$) through resistor $R_5$, through rectifiers $r_6$ and $r_7$ towards terminals *a* and *c* respectively, so that terminals *b* and *d* are also standing at potential $E_0$. A positive pulse arriving at either terminal *a* or *c* momentarily raises the potential of terminal *b* accordingly, since tube $V_3$ is non-conducting, whereas the potential of the terminal *d* does not change. Pulses arriving simultaneously at terminals *a* and *c* cause a current to flow from the source of potential $E_1$, through resistor $R_5$, rectifier $r_8$ and resistor $R_6$ towards the source of potential $E_0$. A positive pulse therefore appears at terminal *d*, whereas tube $V_3$ now conducts momentarily and absorbs the pulse at terminal *b*.

In the case of the arrangement according to Fig. 8, it will be noted that whenever a pulse appears at terminal *a*, there is always a coincident pulse at terminal *c*. For such cases, the discriminating network may be simplified to the circuit shown in Fig. 14. In this circuit, terminal *a* is directly connected to terminal *d* and also to the grid of the tube $V_4$, normally non-conducting, whereas terminal *c* is connected through resistor $R_9$ to terminal *b* and the anode of the tube. If a positive pulse arrives at terminal *c* alone, it is reproduced at terminal *b*. If, however, coincident pulses are applied to terminals *a* and *c*, a corresponding pulse, that is, the pulse applied at terminal *a*, appears also at terminal *d*, whereas the pulse at terminal *b* is absorbed by the tube momentarily conducting.

It will be understood that other discriminating networks may be provided, which perform the function described herebefore. On the other hand, the possible applications of the discriminating networks described are not restricted to those treated in detail herein.

While the principles of the invention have been described in connection with specific apparatus, it is to be clearly understood that this description is made only by way of example and not as a limitation on the scope of the invention.

What is claimed is:

1. An electric binary counting device comprising a plurality of interconnected counting stages, one for each binary denomination and each comprising an input terminal to which electric pulses may be applied, an output terminal, and means for producing a carry-over electric pulse on said output terminal corresponding to every alternate pulse applied to said input terminal, means for normally applying a signal pulse to the input terminals of a selected plurality of said counting stages, detecting means included in said signal-pulse-applying means and connected to the input terminal of one of said selected plurality of counting stages and to the output terminal of a stage of lower denomination than said one stage for detecting coincidence between said signal pulse and a carry-over pulse produced on said output terminal of said lower denomination stage, means effective when said detecting means detects said concidence for preventing the application of any pulse to the input terminal of said one stage, and means controlled by said detecting means for entering a pulse at the stage of next higher denomination than said one stage when said detecting means detects a coincidence between a signal pulse and a carry-over pulse.

2. An electric binary counting device comprising a plurality of interconnected counting stages, one for each binary denomination and each comprising an input terminal to which electric pulses may be applied, an output terminal, and means for producing a carry-over electric pulse on said output terminal corresponding to every alternate pulse applied to said input terminal, means for normally applying a signal pulse to the input terminals of a selected plurality of said counting stages, detecting means included in said signal-pulse-applying means and connected to the input terminal of one of said selected plurality of counting stages and to the output terminal of a stage of lower denomination than said one stage for detecting coincidence between said signal pulse and a carry-over pulse produced on said output terminal of said lower denomination stage, means effective when said detecting means detects said coincidence for preventing the application of any pulse to the input terminal of said one stage, and means controlled by said detecting means for applying a pulse to the input terminal of a stage of higher denomination than said one stage when said detecting means detects a coincidence between a signal pulse and a carry-over pulse.

3. An electric binary counting device, as claimed in claim 2, and further comprising means, effective when said detecting means fails to detect said coincidence and responsive to said signal pulse, for applying a pulse to the input terminal of said one stage.

4. An electric binary counting device, as claimed in claim 3, and in which said means for entering a signal pulse comprises a multi-stage binary counting chain for counting the pulses of a train representing a multiplier, the plurality of selected counting stages of said counting device at which said signal pulse is to be entered being individually controlled by the stages of corresponding denomination of said counting chain, whereby said signal pulse is multiplied by said multiplier in said counting device.

5. An electric binary counting device, as claimed in claim 3, and in which pulse trains each representing a digit of a number expressed in a scale of notation other than the binary scale are entered concurrently at appropriate ones of said counting stages, whereby the binary equivalent of said number is recorded in said counting device.

6. An electric binary counting device, as claimed in claim 3, and further comprising control means for compensating for the pulse propagation delays inherent in said counting stages, whereby a carry-over pulse produced at said output terminal which overlaps said signal pulse is rendered substantially coincident therewith.

7. An electric binary counting device, as claimed in claim 6, and in which said control means comprises delay lines appropriate to the effects of said propagation delays.

8. An electric binary counting device comprising a plurality of counting stages, one for each binary denomination and each having a pulse input terminal and a carry-over output terminal, inter-stage coupling means connected between two counting stages and comprising two signal input terminals, one of which is connected to the output terminal of the preceding counting stage, switching means, a first output terminal connected to the pulse input terminal of the succeeding counting stage, and a second output terminal connected to the input terminal of a different succeeding counting stage, and means for applying electric pulses to the other input terminal of said coupling means, said switching means adapted to produce a pulse on said first output terminal responsive to a pulse applied to either one of said signal input terminals, and in the event of the application of coincident pulses to both said signal input terminals, to prevent the production of coincident pulses on said first output terminal and to produce a pulse on said second output terminal.

9. An electric binary counting device, as claimed in claim 8, and in which said switching means comprises two triodes having their cathodes commoned and having an anode-cathode circuit for said triodes including a resistor connected to the cathodes and separate resistors connected to the anodes, whereby the application of a negative pulse to the grid of each of said triodes causes the potential of said cathodes to become more negative, the resulting negative pulse being applied to said second output terminal, whereas the application of a negative pulse to the grid of either one of said triodes singly causes the potential of the anode of the other triode to become more negative, the resulting negative pulse being applied to said first output terminal.

10. An electric binary counting device, as claimed in claim 8, and in which said switching means comprises a triode, means for normally maintaining the anode thereof at the same potential as said signal input terminals, the first output terminal of the coupling means being connected to said anode, and circuit means operative in response to the application of a signal pulse singly to either one of said signal input terminals for causing the potential of said first output terminal to become momentarily more positive without affecting the operation of said triode, and operative in response to the application of a signal pulse simultaneously to each of said signal input terminals for causing the potential of the grid of said triode to become more positive, rendering said triode conducting, and causing a positive pulse to be applied to said second output terminal, the conducting effect of said triode preventing the application of a pulse to said first output terminal.

11. An electric binary counting device, as claimed in claim 8, and further comprising control means including delay lines for rendering overlapping pulses, applied one to each of the signal input terminals of said coupling means, substantially coincident.

12. An electric binary counting device comprising a plurality of counting stages, one for each binary denomination and each having a pulse input terminal and a carry-over output terminal, coupling means connected to the input terminal of a first one of said stages, to the output terminal of a stage of lower denomination and to the input terminal of a stage of higher denomination and having a signal input terminal, means for applying a signal pulse to the input terminal of a second one of said stages and to said signal input terminal, and means in said coupling means, effective in the event of coincidence between said signal pulse and a carry-over pulse produced at the output terminal of said stage of lower denomination responsive to the application of said signal pulse to said second stage, for preventing the application of a pulse to the input terminal of said first stage and for applying a pulse to the input terminal of said stage of higher denomination.

13. An electric binary counting device comprising a plurality of interconnected counting stages, one for each binary denomination and each comprising an input terminal to which electric pulses may be applied, an output terminal and means for producing a carry-over electric pulse at said output terminal corresponding to every alternate pulse applied to said input terminal, means for entering a signal pulse at a selected plurality of said counting stages, and discriminating means, cooperatively associated with one of said selected plurality of counting stages and with the stages of next lower and next higher denomination, for applying a pulse to the input terminal of said one stage responsive to said signal pulse in the absence of a coincident carry-over pulse produced at the output terminal of said stage of lower denomination and for entering a pulse at said stage of higher denomination responsive to said signal pulse in the presence of said coincident carry-over pulse.

References Cited in the file of this patent

UNITED STATES PATENTS

| | | |
|---|---|---|
| 2,409,689 | Morton et al. | Oct. 22, 1946 |
| 2,429,228 | Herbst | Oct. 21, 1947 |
| 2,590,599 | Evans | Mar. 25, 1952 |
| 2,590,950 | Eckert et al. | Apr. 1, 1952 |
| 2,594,742 | Dickinson | Apr. 29, 1952 |
| 2,610,790 | Elliott | Sept. 16, 1952 |
| 2,634,052 | Bloch | Apr. 7, 1953 |
| 2,685,407 | Robinson | Aug. 3, 1954 |
| 2,689,683 | Gloess et al. | Sept. 21, 1954 |
| 2,719,670 | Jacobs et al. | Oct. 4, 1955 |
| 2,729,811 | Gloess | Jan. 3, 1956 |

FOREIGN PATENTS

| | | |
|---|---|---|
| 1,003,996 | France | Nov. 21, 1951 |
| 830,118 | Germany | Jan. 31, 1952 |
| 667,794 | Great Britain | Mar. 5, 1952 |